(12) United States Patent
van Veldhoven et al.

(10) Patent No.: US 9,658,295 B2
(45) Date of Patent: May 23, 2017

(54) OFFSET COMPENSATION FOR ZERO-CROSSING DETECTION

(71) Applicant: NXP B.V., Eindhoven (NL)

(72) Inventors: Robert Hendrikus Margaretha van Veldhoven, Eindhoven (NL); Fabio Sebastiano, Rotterdam (NL)

(73) Assignee: NXP B.V., Eindhoven (NL)

( * ) Notice: Subject to any disclaimer, the term of this patent is extended or adjusted under 35 U.S.C. 154(b) by 360 days.

(21) Appl. No.: 14/475,082

(22) Filed: Sep. 2, 2014

(65) Prior Publication Data

US 2015/0115933 A1    Apr. 30, 2015

(30) Foreign Application Priority Data

Oct. 30, 2013    (EP) .................................... 13190826

(51) Int. Cl.
*G01R 23/165*    (2006.01)
*G01R 33/00*     (2006.01)
(Continued)

(52) U.S. Cl.
CPC ....... *G01R 33/0029* (2013.01); *G01D 5/2448* (2013.01); *G01P 3/488* (2013.01);
(Continued)

(58) Field of Classification Search
CPC .... G01R 33/0029; G01R 23/02; G01R 23/10; G01R 23/09; G01R 25/00; G01R 25/04;
(Continued)

(56) References Cited

U.S. PATENT DOCUMENTS 4,327,335 A * 4/1982 Missout ................. H03H 17/00
327/558
5,760,629 A * 6/1998 Urabe ....................... H03F 1/30
327/307
(Continued)

FOREIGN PATENT DOCUMENTS

WO         95/11431 A1    4/1995
WO    2011/032713 A1    3/2011

OTHER PUBLICATIONS

Extended European Search Report for EP Patent Appln. No. 13190826.1 (Jun. 27, 2014).
(Continued)

*Primary Examiner* — Thang Le

(57) ABSTRACT

There is described a device for removing an offset from a signal, the device comprising (a) a frequency estimation unit (260) for estimating a frequency of the signal, (b) an offset estimation unit (222) for estimating the offset in the signal by applying an adaptive low pass filter to the signal, wherein a cut-off frequency of the adaptive low pass filter is determined based on the frequency of the signal estimated by the frequency estimation unit (260), and (c) a subtraction unit (230) adapted to subtract the offset estimated by the offset estimation unit (222) from the signal. There is also described a filter unit comprising the device. Furthermore, there is described a corresponding method of removing an offset from a signal as well as a computer program and a computer program product for performing the method by means of a computer.

14 Claims, 2 Drawing Sheets

(51) Int. Cl.
*G01R 23/02* (2006.01)
*G01R 19/25* (2006.01)
*G01D 5/244* (2006.01)
*G01P 3/488* (2006.01)
*G01D 5/245* (2006.01)

(52) U.S. Cl.
CPC ......... *G01R 19/2509* (2013.01); *G01R 23/02* (2013.01); *G01D 5/2451* (2013.01)

(58) Field of Classification Search
CPC G01R 19/02; G01R 19/2509; G01R 27/2605; G01D 5/145; G01D 5/2448; G01D 5/24; G01B 7/023; G01B 7/14; G01B 7/003; G01N 27/9053; G01N 27/9046; G01N 27/82; G01N 27/906; G01N 27/023; G01N 27/2605; G01C 19/5719; G01L 9/12
USPC ......... 324/76.11–76.83, 207.11–207.12, 225, 324/684, 720
See application file for complete search history.

(56) References Cited

U.S. PATENT DOCUMENTS

| | | | | |
|---|---|---|---|---|
| 6,920,622 | B1 * | 7/2005 | Garlepp | H03L 7/081 327/147 |
| 8,705,773 | B2 * | 4/2014 | Lee | H03F 1/30 330/10 |
| 8,953,716 | B1 * | 2/2015 | Venkatasubramanian | H04L 25/061 375/254 |
| 2004/0252037 | A1 * | 12/2004 | Itoh | H03M 1/1019 341/118 |
| 2005/0078780 | A1 * | 4/2005 | Chou | H04L 25/03885 375/350 |
| 2007/0153945 | A1 * | 7/2007 | Gupta | H03F 3/45475 375/346 |
| 2009/0273341 | A1 * | 11/2009 | Hainz | G01P 3/42 324/207.2 |
| 2011/0187341 | A1 * | 8/2011 | Chiu | G05F 1/618 323/285 |
| 2013/0051582 | A1 | 2/2013 | Kropfitsch et al. | |
| 2013/0279717 | A1 | 10/2013 | Reimann et al. | |
| 2013/0328550 | A1 | 12/2013 | Sebastiano et al. | |
| 2015/0077167 | A1 * | 3/2015 | Kerkman | G01R 25/00 327/307 |

OTHER PUBLICATIONS

Enz, C.C. et al. "Circuit Techniques for Reducing the Effects of Op-Amp Imperfections: Autozeroing, Correlated Double Sampling, and Chopper Stabilization", Proc. of the IEEE, vol. 84, No. 11, pp. 1584-1614 (Nov. 1996).

Qinwen, F. et al. "A 21 nV/ √Hz Chopper-Stabilized Multi-Path Current-Feedback Instrumentation Amplifier With 2 μV Offset", IEEE J. of ,Solid-State Circuits, vol. 47, No. 2, pp. 464-475 (Feb. 2012).

* cited by examiner

OFFSET COMPENSATION FOR ZERO-CROSSING DETECTION

CROSS-REFERENCE TO RELATED APPLICATIONS

This application claims the priority under 35 U.S.C. § 119 of European patent application no. 13190826.1, filed on Oct. 30, 2013, the contents of which are incorporated by reference herein.

FIELD OF THE INVENTION

The present invention relates to the field of offset compensation, in particular to removal of offset from a magnetic sensor signal for zero-crossing detection.

ART BACKGROUND

Magnetic sensors in combination with permanent magnets or magnetized components can be used to sense the speed of mechanical components. For example, if a magnetic sensor is placed at close distance from a magnetized wheel, whose circumference is divided into sections alternatively magnetized as magnetic south and north, the magnetic sensor will sense a periodic magnetic field as the wheel rotates. By analyzing the output of the sensor and knowing the mechanical construction of the wheel, it is possible to determine, for example, the frequency of the time varying magnetic field at the sensor location and, consequently, the angular speed of the wheel.

In some applications, only specific positions of the mechanical part need to be detected. This translates in the detection of the instants at which the output of the magnetic sensor has particular values. For example, in many practical cases, it is interesting to identify the instants of the zero-crossing of the magnetic field.

In other applications, a permanent magnet is attached to a mechanical part and in order to measure the angle of rotation of such part, the direction of the magnetic field is sensed by an angular magnetic sensor.

Any error in the sensor or in its readout, such as any offset superimposed onto the signal, will cause an error in the determination of the zero crossings. In many magnetic sensors, such as Anisotropic Magnetic Resistance (AMR) sensors, offset can be even larger than the signal amplitude, resulting in unacceptable errors or even in no detection. Moreover, if any offset is present in the magnetic domain, such as any DC stray field parallel to the field to be sensed, many conventional techniques for offset cancellation do not work properly.

Offset can be extrapolated by observing the sensor output signal for a limited amount of time and fitting it with the expected signal. However, this is unpractical if the signal is observed for less than one period and requires the knowledge of some characteristics of the signal (e.g., shape, amplitude, frequency) which are not always available. Alternatively, the offset can be obtained by averaging one period of the sensor output signal and without any prior knowledge about the signal properties. However, in some applications, such as in the detection of the speed of car wheels at start up, it is not allowed to wait for a full period of the output signal before generating the first accurate zero-crossing signal. This stringent time constraint is due to the fact that in such cases, sub-Hz magnetic fields are observed and waiting for a full period of the signal would result in a too large latency.

A common solution to the above problems is calibration of the offset during testing. This can be done by laser trimming of the sensor or by measuring the offset during testing and using feed-forward compensation during normal operation. However, such techniques increase the testing costs and may result in inaccurate results due to offset variations caused by temperature changes or ageing.

There may thus be a need for a simple and cost efficient way of obtaining accurate detection of zero-crossing, in particular without additional calibration and with only limited information about the signal.

SUMMARY OF THE INVENTION

This need may be met by the subject matter according to the independent claims. Advantageous embodiments of the present invention are set forth in the dependent claims.

According to a first aspect there is provided a device for removing an offset from a signal, the device comprising (a) a frequency estimation unit for estimating a frequency of the signal, (b) an offset estimation unit for estimating the offset in the signal by applying an adaptive low pass filter to the signal, wherein a cut-off frequency of the adaptive low pass filter is determined based on the frequency of the signal estimated by the frequency estimation unit, and (c) a subtraction unit adapted to subtract the offset estimated by the offset estimation unit from the signal.

This aspect is based on the idea that the cut-off frequency of the adaptive low pass filter that is used to estimate the offset in the signal is determined in dependence on the estimated frequency of the signal. Thereby, it is possible to assure that the cut-off frequency is low enough to effectively attenuate the time-varying part of the signal (i.e. so low that substantially only the offset gets through the filter) while at the same time preventing the cut-off frequency from being set so low that the filter's settling time (which is generally proportional to $1/f_{cut-off}$) becomes unnecessarily long. In other words, the cut-off frequency can be set such that an optimal trade-off is achieved between precise estimation of the offset and short filter settling time.

The signal may in particular be a time-varying output signal from a magnetic sensor. The magnetic sensor may e.g. be arranged to measure rotational speed of a wheel or axis in an automobile vehicle.

In the present context, the term "offset" may particularly denote a substantially constant component of the signal.

In the present context, the term "cut-off frequency" may particularly denote the frequency where the adaptive low pass filter attenuates the signal amplitude by a predetermined amount, such as 3 dB.

In the present context, the term "adaptive low pass filter" may in particular denote a low pass filter with adjustable cut-off frequency.

By adapting the cut-off frequency of the low pass filter based on the estimated frequency of the signal, a precise and rapid estimation of the offset superimposed on the time-varying part of the sensor signal can be obtained for any signal frequency. Thereby, by subtracting the estimated offset from the signal, precise detection of the zero-crossings of the time-varying signal part is facilitated.

The invention can also be applied to angular sensors, to cancel the sensor offset and obtain a more accurate reading.

According to an embodiment, the offset estimation unit is adapted to set the cut-off frequency of the adaptive low-pass filter to the frequency of the signal estimated by the frequency estimation unit divided by a constant k.

In other words, the cut-off frequency is set to a fraction of the estimated signal frequency.

The constant k is larger than one and is generally selected such that the adaptive low pass filter effectively attenuates signal content at the estimated frequency. In particular, the constant k may be selected such that the amplitude of a signal component at the estimated frequency is attenuated to about 1% of the actual amplitude. Preferably, the constant k is in the range between 10 and 25, such as in the range between 12 and 23, such as in the range between 15 and 20, such as around 17.

According to a further embodiment, the device further comprises a comparator unit. The comparator unit is coupled to an output of the subtraction unit and is adapted to generate a rectangular wave alternating between a positive value and a negative value in dependency on the sign of the signal received from the subtraction unit.

In other words, the comparator unit is adapted to detect whether the signal received from the subtraction unit is positive or negative and to generate a signal having a positive value when the signal received from the subtraction unit is positive and a negative value when the signal received from the subtraction unit is negative, i.e. a signal having a rectangular waveform.

The rectangular waveform may substantially be a square wave, when the estimated offset is equal to or close to the actual offset. In other words, the duty cycle of the rectangular waveform approaches 50% when the estimated offset approaches the actual offset.

The rectangular waveform is preferably symmetrical in the sense that it alternates between +a and −a (e.g. between +1 and −1).

Thereby, the comparator unit may facilitate detection of the signal's zero crossings, which occur at the instants where the rectangular waveform changes from its positive value to its negative value and vice versa.

According to a further embodiment, the frequency estimation unit is adapted to estimate the frequency of the signal by measuring a pulse width of the rectangular wave generated by the comparator unit.

By measuring the pulse width of the rectangular wave, i.e. the duration of one half cycle of the signal in the ideal case, a frequency estimate may be calculated as $f_{est}=1/(2*T)$, where T denotes the duration corresponding to the measured pulse width.

According to a further embodiment, the frequency estimation unit comprises an internal clock adapted to generate a clock signal having a predetermined clock frequency $f_{clk}$, and the frequency estimation unit is adapted to measure the pulse width of the rectangular wave generated by the comparator unit by counting the number of clock pulses M of the internal clock signal during a pulse of the rectangular wave generated by the comparator unit.

The predetermined clock frequency is preferably substantially larger than an expected maximum frequency of the signal, e.g. around 100 or more times the expected maximum frequency. In one embodiment, the expected maximum frequency may be around 10 kHz and the predetermined clock frequency may be around 1 MHz.

According to a further embodiment, the frequency estimation unit is adapted to estimate the frequency of the signal as $f_{clk}/(2*M)$.

This estimate is calculated based on the assumption that the pulse that has a duration corresponding to the M counted clock pulses is a half signal cycle, such that the duration (in seconds) of the half cycle is equal to $M/f_{clk}$.

According to a further embodiment, the frequency estimation unit is adapted to set an initial value of the estimated frequency to equal a predetermined maximum frequency of the signal.

The initial value may in particular be the value of the estimated frequency that is used at start-up of the device, i.e. when no estimation of the signal frequency has yet taken place.

By setting the initial value of the estimated frequency to equal the predetermined maximum frequency of the signal, e.g. 10 kHz, a short settling time of the adaptive low pass filter is achieved such that a first offset estimate can be rapidly calculated and then subsequently improved.

According to a second aspect, there is provided a magnetic sensor unit, comprising (a) a magnetic sensor adapted to generate a sensor output signal in response to an external magnetic field, and (b) a device according to the first aspect or any of the above embodiments, the device being adapted to receive the sensor output signal generated by the magnetic sensor and to remove an offset from the sensor output signal.

The magnetic sensor unit according to this aspect is capable of providing a useful offset-corrected output signal in a very short time after start up.

According to a third aspect, there is provided a method of removing an offset from a signal, the method comprising (a) estimating a frequency of the signal, (b) estimating the offset in the signal by applying an adaptive low pass filter to the signal, wherein a cut-off frequency of the adaptive low pass filter is determined based on the estimated frequency of the signal, and (c) subtracting the estimated offset from the signal.

This aspect is essentially based on the same idea as the first aspect described above, i.e. that the cut-off frequency of the adaptive low pass filter that is used to estimate the offset in the signal is determined in dependence on the estimated frequency of the signal. Thereby, the cut-off frequency can be set such that an optimal trade-off is achieved between precise estimation of the offset and short filter settling time.

The method may preferably be implemented in a device according to the first aspect and any of the embodiments thereof as described above.

According to a fourth aspect, there is provided a computer program comprising computer executable instructions which when executed by a computer causes the computer to perform the steps of the method according to the third aspect.

According to a fifth aspect, there is provided a computer program product comprising a computer readable data carrier loaded with a computer program according to the fourth aspect.

It is noted that embodiments of the invention have been described with reference to different subject matters. In particular, some embodiments have been described with reference to method type claims whereas other embodiments have been described with reference to apparatus type claims. However, a person skilled in the art will gather from the above and the following description that, unless otherwise indicated, in addition to any combination of features belonging to one type of subject matter also any combination of features relating to different subject matters, in particular a combination of features of the method type claims and features of the apparatus type claims, is also disclosed by this document.

The aspects defined above and further aspects of the present invention are apparent from the examples of embodiment to be described hereinafter and are explained with reference to the examples of embodiment. The invention will be described in more detail hereinafter with reference to examples of embodiment to which the invention is, however, not limited.

DETAILED DESCRIPTION

Figure 1:
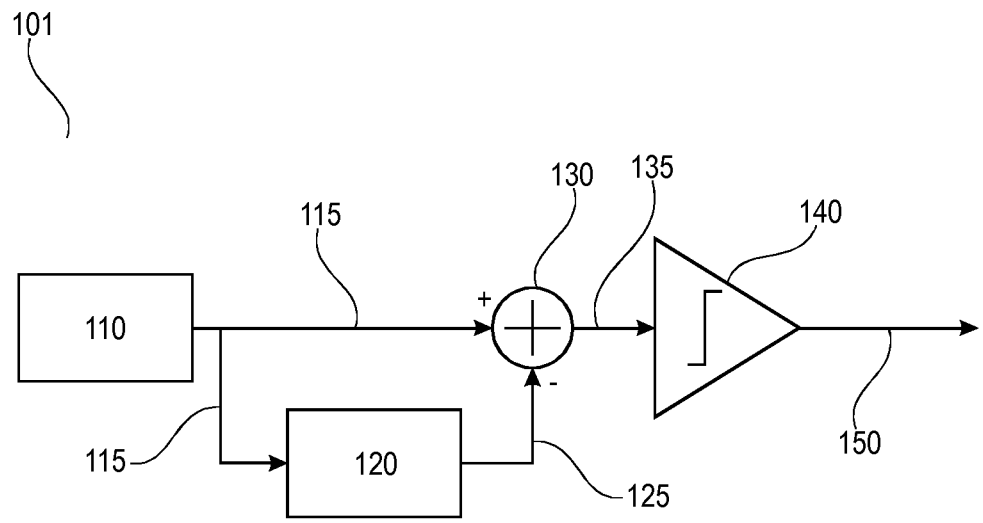
FIG. 1 shows a circuit diagram of a sensor unit with non-adaptive offset compensation for comparison with embodiments of the present invention.

The illustration in the drawing is schematic. It is noted that, unless otherwise indicated, similar or identical elements in different figures are provided with the same reference signs or with reference signs, which differ only within the first digit.

FIG. 1 shows a circuit diagram of a sensor unit 101 with non-adaptive offset compensation for comparison with embodiments of the present invention. Before describing an embodiment of the present invention, a discussion of the sensor unit 101 will be given as background information.

The sensor unit 101 comprises a magnetic sensor 110, a low pass filter 120, a subtraction unit 130, and a comparator 140. As shown in FIG. 1, the direct output 115 from the magnetic sensor 110 is fed to the low pass filter 120 and to the subtraction unit 130. The low pass filter 120 is designed to filter out the time-varying part of the sensor output signal 115 and to forward a corresponding offset estimate 125 to the subtraction unit 130. The subtraction unit 130 subtracts the offset estimate 125 from the sensor output signal 115 and provides a corresponding offset compensated sensor signal 135 to the comparator 140. The comparator 140 generates an output signal 150 having a rectangular waveform which takes on a constant positive value as long as the offset compensated sensor signal 135 is positive and a corresponding negative value as long as the offset compensated sensor signal 135 is negative.

Now, the design of the low pass filter 120 is described. Assuming that the system 101 is working in the steady state and that the low pass filter 120 is a first-order filter with pole at frequency $f_p$, the sensor signal 115 $s(t)$ and the offset estimate 125 $V_{OS,est}(t)$ can be written as:

$$s(t) = A\sin(2\pi f t + \theta) + V_{OS}$$

$$V_{OS,est}(t) = \alpha A \sin(2\pi f t + \theta + \varphi) + V_{OS}$$

where A is the amplitude of the sensor signal 115, $f$ is the frequency of the sensor signal 115, $\theta$ is the phase of the sensor signal 115, $V_{OS}$ is the sensor offset, $\alpha$ is the attenuation of the filter 120 and $\varphi$ is the phase-shift of the filter 120. The two latter are given by $$\alpha = \left[1 + \left(\frac{f}{f_p}\right)^2\right]^{-0.5}, \varphi = -\tan^{-1}\left(\frac{f}{f_p}\right)$$

where $f_p$ is the pole frequency of the filter 120.

The error on the zero-crossing can be found by imposing $V_{OS,est}(\Delta t) = s(\Delta t)$. In a typical application, the error e is often expressed as a fraction of the signal period T, i.e.

$$e = \frac{\Delta t}{T} = \frac{1}{2\pi}\tan^{-1}\left(\frac{\alpha \sin\varphi}{1 - \alpha\cos\varphi}\right)$$

From this, e.g. by plotting the relative error e (not shown), it can be found that the pole frequency $f_p$ of the filter 120 must be a factor k lower than the signal frequency in order to limit the error, i.e.

$$f_p < \frac{1}{k}f$$

In this way, it can for example be derived that the absolute error |e|<1% for k>16.

The abovementioned limitation for $f_p$ ensures that the system 101 shows a low error on zero-crossing detection at steady state. However, when starting up the system, an additional source of error comes from the settling of the filter. Under the approximation that the filter 120 attenuates the AC component down to a negligible level (i.e. the filter 120 is sized as previously described), the settling can be approximated as an exponential settling during which the offset estimation of the system 101 in FIG. 1 has a large error. An error in the offset estimation would result in an output rectangular waveform with a duty-cycle different from 50% (which would be obtained when slicing s(t) with an ideal threshold equal to $V_{OS}$). An error in duty-cycle lower than ΔDC is obtained if:

$$|V_{OS,est}(t) - V_{OS}| = |V_{OS,est}(0) - V_{OS}|e^{-t/\tau} < A\sin(2\pi \cdot \Delta DC)$$

where τ is the time constant of the filter 120. The required settling time would then be:

$$t_{settle} = \frac{1}{2\pi f_p}\ln\frac{|V_{OS,est}(0) - V_{OS}|}{A\sin(2\pi \cdot \Delta DC)} \leq \frac{1}{2\pi f_p}\ln\frac{1}{\sin(2\pi \cdot \Delta DC)} = t_{settle,max}$$

The last inequality holds if the initial state of the filter is set so that $V_{OS,est}(0) = s(0)$, i.e. by assuming the value of the signal at start-up as initial offset estimate. Note that under this assumption the worst case settling can be obtained for example for an initial signal phase of $\theta = \pi/2$.

To compute the worst-case settling time, it should be considered that the system 101 must work over a specified range of input signal frequency, from $f_{min}$ to $f_{max}$.

The upper bound for the pole of the filter is fixed by the minimum frequency, i.e.

$$f_p < \frac{1}{k}f_{min}$$

The maximum number of signal cycles $N_{max}$ that are required for proper settling (for a fixed duty-cycle error) is instead determined by the maximum frequency:

$$N_{max} = f_{max}t_{settle,max} = \frac{f_{max}}{2\pi f_p}\ln\frac{1}{\sin(2\pi \cdot \Delta DC)} > \frac{f_{max}}{f_{min}}\frac{k}{2\pi}\ln\frac{1}{\sin(2\pi \cdot \Delta DC)}$$

With typical parameters (e<1%, ΔDC<10%, $f_{max}/f_{min}$>1000), $N_{max}$>1350.

Thus, if a wide range of input signal frequencies must be accommodated, a large number of cycles are required for settling in the worst case. In many applications, $N_{max}$ is not even allowed to be more than 1, such that the system 101 cannot be used. However, the present invention provides a solution to this problem as described in terms of the following embodiment.

Figure 2:
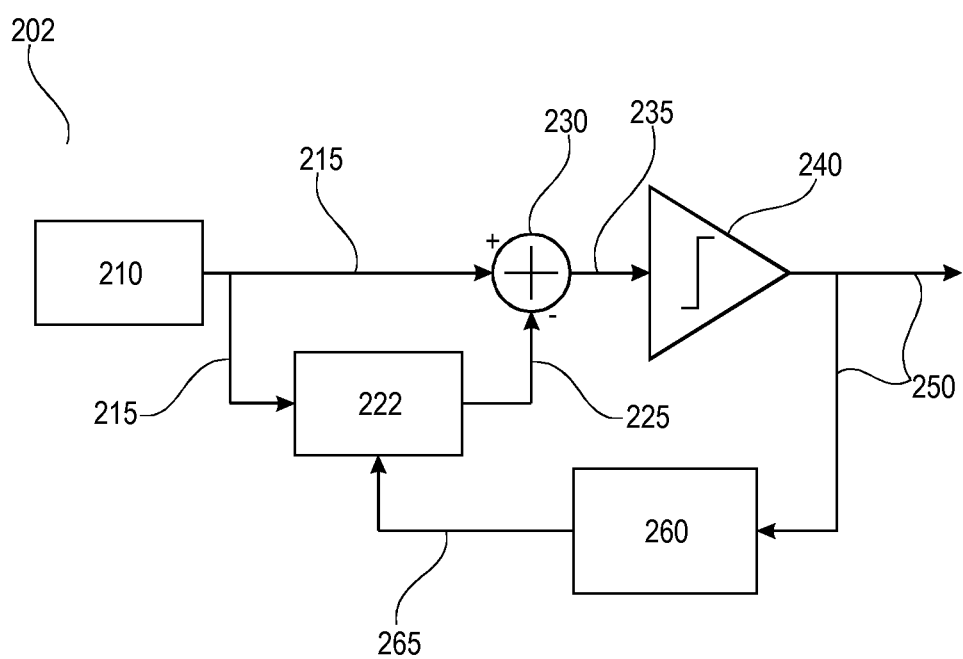
FIG. 2 shows a circuit diagram of a sensor unit with adaptive offset compensation in accordance with an embodiment.

FIG. 2 shows a circuit diagram of a sensor unit 202 with adaptive offset compensation in accordance with an embodiment.

The sensor unit 202 comprises a sensor 210, a subtraction unit 230 and a comparator 240 respectively corresponding to the sensor 110, the subtraction unit 130 and the comparator 140 of the sensor unit 101 shown in FIG. 1 and discussed above. However, instead of the low pass filter 120 shown in FIG. 1, the sensor unit 202 comprises a linear adaptive low pass filter 222 with adaptive bandwidth (adaptive cut-off frequency or pole frequency). Furthermore, the sensor unit 202 comprises a frequency estimation unit 260 coupled to estimate the frequency of the output signal 250 from the comparator 240 and to feed the estimated frequency 265 to the adaptive low pass filter 222. The adaptive low pass filter 222 dynamically adapts its bandwidth in dependency on the received estimated frequency 265 and, like in the sensor unit 101 discussed above and shown in FIG. 1, feeds an estimated offset 225 to the subtraction unit 230.

At start-up, the output of the adaptive filter 222 is initialized to the value of the signal 215 at start-up. In other words, the offset estimate 225 is initialized to the value of the signal 215 at start-up. Since the offset superimposed on the time-varying signal can be even larger than the amplitude of the time-varying signal itself, this ensures that at start-up the error in offset estimation is limited to less than the signal amplitude.

The bandwidth of the low-pass filter 222 is estimated as follows: The frequency estimation unit 260 comprises an internal clock signal generator (not shown) with predetermined frequency $f_{clk}$. Furthermore, the frequency estimation unit 260 comprises processor and memory (not shown) for handling two internal variables labeled N and M that are used to count and store an estimation of the duration of a half cycle of the output signal 250 in terms of internal clock cycles.

At start-up, N is initialized to $$N_{start} = \left\lfloor \frac{f_{clk}}{2 f_{max}} \right\rfloor.$$

Then, after each cycle of the internal clock signal, N is incremented by 1 if the sign of the output signal 250 has not changed during the cycle. Otherwise, i.e. if the sign of the output signal 250 has changed during the cycle, N is reset to 1. Also, if the sign of the output signal 250 has not changed during the cycle and N≤M, M is left unchanged. Otherwise, if the sign of the output signal 250 has not changed during the cycle but N>M, M is set equal to N. Similarly, if the sign of the output signal 250 has changed during the cycle, M is set equal to N (irrespectively of the current values of N and M).

At any time, i.e. after each cycle of the internal clock signal, the estimated frequency 265 is set to $f_{est} = f_{clk}/(2*M)$. Then, upon receiving the estimated frequency 265, the adaptive filter 222 dynamically adjusts its bandwidth (i.e. cut-off frequency) to $f_{est}/k$, where the constant k is selected in line with the above discussion of the same with regard to the non-adaptive case shown in FIG. 1.

It is noted that the above described embodiment may be varied in various ways as required by specific implementation requirements. For example, the frequency estimation unit 260 may, instead of outputting an estimated frequency 265 to the adaptive filter 222 as described above, directly output the bandwidth $f_{est}/k$ to the adaptive filter 222 such that the latter does not have to perform the corresponding calculation.

Figure 3:
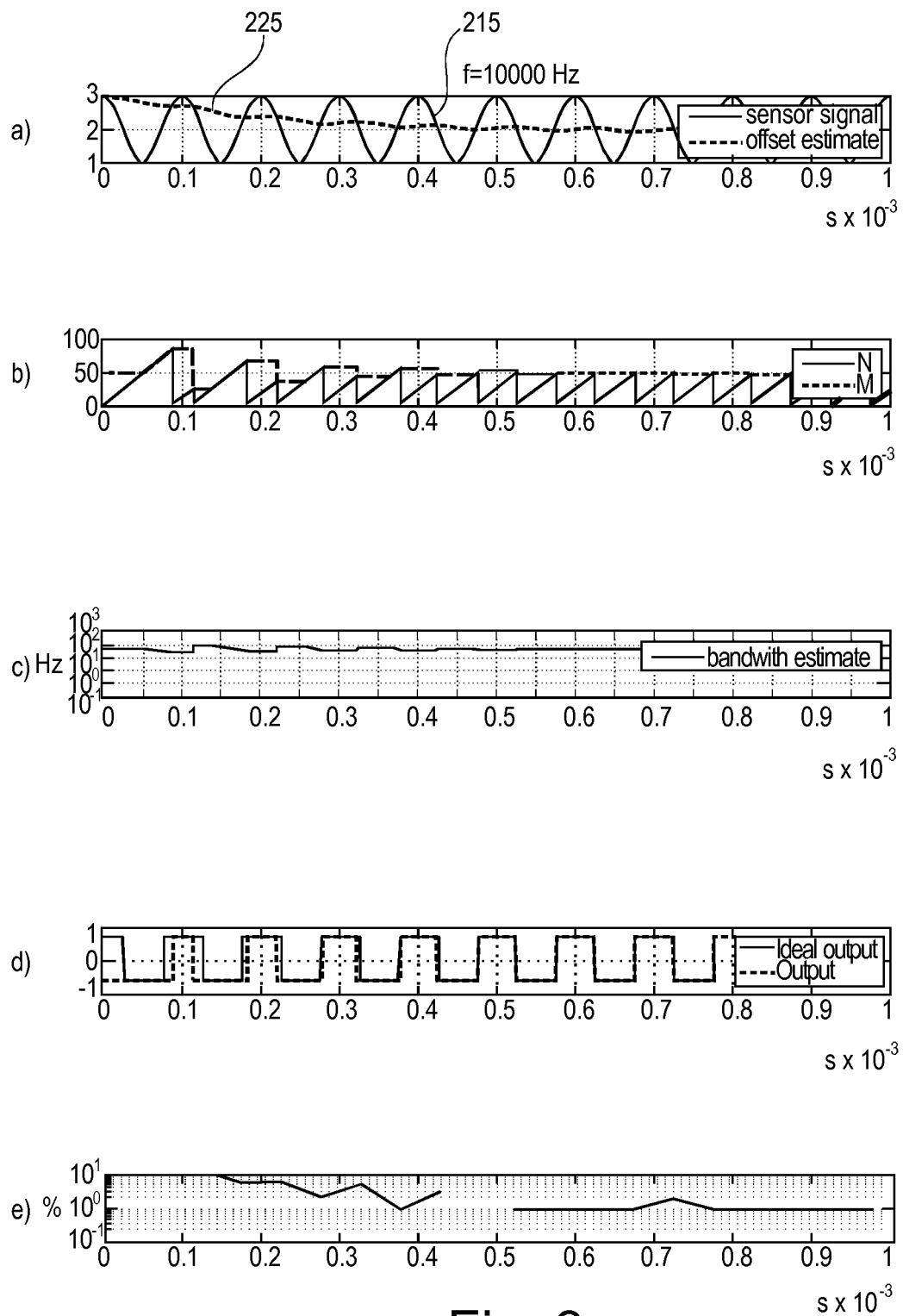
FIG. 3 shows exemplary waveforms relating to offset compensation in accordance with the embodiment shown in FIG. 2.

FIG. 3 shows exemplary (simulated) waveforms relating to offset compensation in accordance with the embodiment shown in FIG. 2 and discussed above, where the frequency of the sensor signal is $f=10$ kHz, $k=17$, the internal clock frequency is $f_{clk}=1$ MHz, and the maximum frequency $f_{max}=10$ kHz. More specifically, the first (i.e. the upper) graph *a*) of FIG. 3 shows the sensor signal 215 (solid curve) and the offset estimate 225 (dashed curve) as functions of time. As can be seen, the sensor signal 215 oscillates between the values 1 and 3 and thus has an actual offset of 2. The offset estimate 225 starts at the value 3 and converges rapidly (within 6-7 cycles) towards the actual offset. The second graph *b*) shows the variables N (solid curve) and M (dashed curve) as functions of time. As shown, both N and M starts at the value $f_{clk}/(2*f_{max})=50$. After the first internal clock cycle, N is decreased to one as the sign of the signal 250 (i.e. the sensor signal 215 minus the offset estimate 225) has changed to negative. Thereafter, N is increased by one after each internal clock cycle while M keeps the initial value 50. Once N exceeds 50, M follows the value of N. When the sign of the signal 250 changes to positive, M maintains its last value and N is reset to 1, and so on. The third graph *c*) shows the estimated bandwidth (cut-off frequency) $f_{est}/k$ as a function of time. As can be seen, the estimated bandwidth converges toward a stable value with approximately the same speed as the offset estimate sown in graph *a*) of FIG. 3. The fourth graph *d*) shows the ideal output signal (solid curve) of the sensor unit 202 and the actual output signal 250 (dashed curve) as functions of time. As can be seen, the output signal 250 (dashed) closely resembles the ideal output once the offset estimate 225 shown in graph *a*) of FIG. 3 gets close to the actual offset value 2. Finally, the last (fifth) graph *e*) shows the zero-crossing error in % as a function of time. This curve confirms the above statement with regard to the resemblance between the actual output signal 250 and the ideal output.

In the simulation illustrated in FIG. 3 and discussed above, the starting value for the bandwidth estimate is equal to $f_{max}/k=588$ Hz. The steady-state frequency cut-off value is proportional to the signal frequency and equal to $f/k$. Thus, in the illustrated simulation the steady state frequency value is equal to the starting value, i.e. 588 Hz. The final error on the zero-crossing detection is around 1%, as predicted above in conjunction with FIG. 1, for a ratio of 17 between the signal frequency and the filter frequency.

Further simulations for other signal frequencies (below 10 kHz) have shown similar behaviour, i.e. that the steady-state is reached in approximately six cycles of the input signal. In case of a fixed-bandwidth system with similar performance, the settling time would (as discussed above in conjunction with FIG. 1) have been more than 1000 cycles for a signal at maximum frequency.

It should be noted that the term "comprising" does not exclude other elements or steps and that the use of the articles "a" or "an" does not exclude a plurality. Also elements described in association with different embodiments may be combined. It should also be noted that reference signs in the claims should not be construed as limiting the scope of the claims.

The invention claimed is:

1. A device for removing an offset from a signal outputted by a sensor, the device comprising
an output port of a comparator unit;
a frequency estimation unit configured to estimate a frequency of the signal;
an offset estimation unit configured to estimate the offset in the signal by applying an adaptive low pass filter to the signal, wherein a cut-off frequency of the adaptive low pass filter is determined based on the frequency of the signal estimated by the frequency estimation unit, wherein an input to the frequency estimation unit is coupled to the output port and an output of the frequency estimation unit is inputted to the adaptive low pass filter; and
a subtraction unit adapted to subtract the offset estimated by the offset estimation unit from the signal wherein an input to the adaptive low pass filter is coupled to a first input to the subtraction unit and an output of the adaptive low pass filter is inputted to a second input to the subtraction unit and an output of the subtraction unit is coupled to the output port.

2. The device according to claim 1, wherein the offset estimation unit is adapted to set the cut-off frequency of the adaptive low-pass filter to the frequency of the signal estimated by the frequency estimation unit divided by a constant k.

3. The device according to claim 1, wherein the comparator unit is coupled to an output of the subtraction unit and is adapted to generate a rectangular wave alternating between a positive value and a negative value in dependency on the sign of the signal received from the subtraction unit.

4. The device according to claim 3, wherein the frequency estimation unit is adapted to estimate the frequency of the signal by measuring a pulse width of the rectangular wave generated by the comparator unit.

5. The device according to claim 1, wherein the frequency estimation unit comprises an internal clock adapted to generate a clock signal having a predetermined clock frequency fcik, and wherein the frequency estimation unit is adapted to measure a pulse width of a rectangular wave generated by the comparator unit by counting the number of clock pulses M of an internal clock signal during a pulse of the rectangular wave generated by the comparator unit.

6. The device according to claim 1, wherein the frequency estimation unit is adapted to estimate the frequency of the signal as $f_{clk}/(2*M)$.

7. The device according to claim 5, wherein the frequency estimation unit is adapted to set an initial value of the estimated frequency to equal a predetermined maximum frequency of the signal.

8. A magnetic sensor unit, comprising
a magnetic sensor adapted to generate a sensor output signal in response to an external magnetic field, and
a device according to claim 1, the device being adapted to receive the sensor output signal generated by the magnetic sensor and to remove an offset from the sensor output signal.

9. A method of removing an offset from a signal outputted by a sensor, the method comprising
estimating, by using a frequency estimation unit, a frequency of the signal at an output port of a comparator unit;
estimating, by using an offset estimation unit, the offset in the signal by applying an adaptive low pass filter to the signal, wherein a cut-off frequency of the adaptive low pass filter is determined based on the estimated frequency derived at the output port, of the signal; and
subtracting, by using a subtracting unit, the estimated offset from the signal and outputting the subtracted signal to the output port, wherein an input to the adaptive low pass filter is coupled to a first input to the subtracting unit and an output of the adaptive low pass filter is coupled to a second input the subtracting unit.

10. A non-transitory computer readable media comprising computer executable instructions which when executed by a computer causes the computer to perform the steps of the method according to claim 9.

11. A device for removing an offset from a signal outputted by a sensor, the device comprising
a frequency estimation unit configured to estimate a frequency of the signal;
an offset estimation unit configured to estimate the offset in the signal by applying an adaptive low pass filter to the signal, wherein a cut-off frequency of the adaptive low pass filter is determined based on the frequency of the signal estimated by the frequency estimation unit;
a subtraction unit adapted to subtract the offset estimated by the offset estimation unit from the signal; and
a comparator unit, wherein the comparator unit is coupled to an output of the subtraction unit and is adapted to generate a rectangular wave alternating between a positive value and a negative value in dependency on the sign of the signal received from the subtraction unit.

12. The device according to claim 11, wherein the offset estimation unit is adapted to set the cut-off frequency of the adaptive low-pass filter to the frequency of the signal estimated by the frequency estimation unit divided by a constant k.

13. The device according to claim 11, wherein the frequency estimation unit is adapted to estimate the frequency of the signal by measuring a pulse width of the rectangular wave generated by the comparator unit.

14. The device according to claim 11,
wherein the frequency estimation unit comprises an internal clock adapted to generate a clock signal having a predetermined clock frequency $f_{clk}$, and
wherein the frequency estimation unit is adapted to measure the pulse width of the rectangular wave generated by the comparator unit by counting the number of clock pulses M of the internal clock signal during a pulse of the rectangular wave generated by the comparator unit.

* * * * *